United States Patent
Edler

(10) Patent No.: US 9,927,638 B2
(45) Date of Patent: Mar. 27, 2018

(54) OPERATING A POCKELS CELL

(71) Applicant: TRUMPF LASER GMBH, Schramberg (DE)

(72) Inventor: Hans Georg Edler, Aichhalden (DE)

(73) Assignee: TRUMPF LASER GMBH, Schramberg (DE)

( * ) Notice: Subject to any disclaimer, the term of this patent is extended or adjusted under 35 U.S.C. 154(b) by 258 days.

(21) Appl. No.: 14/734,455

(22) Filed: Jun. 9, 2015

(65) Prior Publication Data
US 2015/0268486 A1 Sep. 24, 2015

Related U.S. Application Data

(63) Continuation of application No. PCT/EP2013/003712, filed on Dec. 9, 2013.

(30) Foreign Application Priority Data

Dec. 10, 2012 (DE) .................. 10 2012 222 606

(51) Int. Cl.
*G02F 1/03* (2006.01)
*H03K 17/10* (2006.01)
*H01S 3/115* (2006.01)

(52) U.S. Cl.
CPC ............ *G02F 1/0327* (2013.01); *H01S 3/115* (2013.01); *H03K 17/102* (2013.01)

(58) Field of Classification Search
CPC ...... G02F 1/0327; H01S 3/115; H03K 17/102
See application file for complete search history.

(56) References Cited

U.S. PATENT DOCUMENTS

| | | | |
|---|---|---|---|
| 3,910,679 A | 10/1975 | Rushworth et al. | |
| 4,441,186 A * | 4/1984 | Erickson | H01S 3/107 359/278 |
| 5,412,531 A * | 5/1995 | Clapp, III | H03K 17/08142 307/113 |
| 5,881,082 A | 3/1999 | Yabuuchi | |
| 6,184,662 B1 | 2/2001 | Yabuuchi et al. | |
| 7,649,667 B2 | 1/2010 | Bergmann et al. | |
| 7,755,217 B2 | 7/2010 | Heuermann | |
| 8,610,990 B2 | 12/2013 | Bergmann | |

(Continued)

FOREIGN PATENT DOCUMENTS

| | | |
|---|---|---|
| DE | 3630775 A1 | 3/1988 |
| DE | 10251888 B4 | 4/2005 |
| DE | 10356648 A1 | 7/2005 |

(Continued)

OTHER PUBLICATIONS

International Search Report for corresponding PCT Application No. PCT/EP2013/003712, dated Apr. 16, 2014, 4 pages.

*Primary Examiner* — Xinning Niu

(74) *Attorney, Agent, or Firm* — Fish & Richardson P.C.

(57) ABSTRACT

A Pockels cell driver circuit has a first circuit node that can be connected to a first terminal of a Pockels cell and a second circuit node that can be connected to a second terminal of the Pockels cell. The first circuit node is connected via a first switch to a positive potential and the second circuit node is connected via a second switch to a negative potential. The first circuit node is connected to the second circuit node via a short-circuit switch which is controlled for discharge of a linked Pockels cell.

18 Claims, 3 Drawing Sheets

(56) References Cited

U.S. PATENT DOCUMENTS

2004/0101001 A1    5/2004  Bergmann et al.
2011/0194576 A1*   8/2011  Bergmann ............ G02F 1/0327
                                                            372/25

FOREIGN PATENT DOCUMENTS

| DE | 102005061716 A1 | 7/2007 |
| DE | 102007004391 B3 | 8/2008 |
| DE | 102006060417 B4 | 9/2008 |
| DE | 102007053482 B3 | 8/2009 |
| DE | 102010002231 A1 | 8/2011 |
| JP | 56140686 A | 11/1981 |
| JP | H02197269 A | 8/1990 |
| JP | H02304991 A | 12/1990 |
| WO | WO2011009467 A1 | 1/2011 |

* cited by examiner

OPERATING A POCKELS CELL

CROSS-REFERENCE TO RELATED APPLICATIONS

This application is a continuation of and claims priority under 35 U.S.C. § 120 to PCT Application No. PCT/EP2013/003712 filed on Dec. 9, 2013, which claimed priority to German Application No. DE 10 2012 222 606.0, filed on Dec. 10, 2012. The contents of both of these priority applications are hereby incorporated by reference in their entirety.

TECHNICAL FIELD

The invention relates to operating a Pockels cell, particularly to a driver circuit for a pockels cell and a method for operating the Pockels cell.

BACKGROUND

A Pockels cell includes an electro-optic crystal through which electromagnetic radiation (e.g., laser light with $\lambda=0.2$ to 2 µm) can propagate. A phase displacement that the electromagnetic radiation experiences inside the crystal can be altered by applying a varying electric voltage (i.e., Pockels effect). The Pockels cell acts as a voltage-dependent wave plate.

Pockels cells are used in electro-optic modulators along with further optical components, such as polarizers, and can thus be utilized as decouplers and input couplers for electromagnetic radiation in lasers. In order to move the modulator into a locked or open status, a variable voltage is applied to the Pockels cell. They can thus be used in lasers, e.g., to generate pulses in regenerative amplifiers or lasers in accordance with the "cavity dump" principle. The voltage is controlled by means of a Pockels cell driver circuit. When using the laser in materials processing, the laser usually needs to supply ultra-short high energy pulses. In the case of a regenerative amplification system, for example, the laser beam is, for this purpose, coupled into the optical amplifier via the Pockels cell and passes through the optical amplifier as often as necessary until the required amount of energy is achieved, and is then decoupled again. For this purpose, the switching process needs to occur in the resonator of the regenerative amplifier within a period of revolution. It is in fact the case that, the shorter the switching time (steep switching flank), the more switching cycles can be achieved within a predefined amplification time (high clock speed). It often proves to be difficult, however, to activate Pockels cells. Especially with the high laser output, high voltages are required, which need to be applied within a short time or switched off.

U.S. Pat. No. 3,910,679 describes a configuration of a Pockels cell driver. The configuration is termed an "H" configuration, and the mode of operation is referred to as a push/pull circuit. This configuration has a disadvantage that the thermal load affecting the components becomes very high with high laser output and fast switching times, as many components need to be used and activated and the extremely short switching times can no longer be achieved. The entire system also becomes more and more prone to breakdown due to thermal overload.

SUMMARY

One aspect of the invention features a driver circuit for a Pockels cell having a first circuit node that can be connected to a first terminal of the Pockels cell and a second circuit node that can be connected to a second terminal of the Pockels cell. The first circuit node is connected via a first switch to a positive potential and the second circuit node is connected via the second switch to a negative potential. The first circuit node can be connected to the second circuit node via a short-circuit switch which is activated for discharge of a linked Pockels cell.

In the Pockels cell driver circuit, the Pockels cell terminals, e.g., the circuit nodes, have a symmetrically distributed positive and negative potential in relation to ground. A control circuit for the Pockels cell driver circuit can thus be connected to ground. The control circuit can be connected to the switches. With the Pockels cell driver circuit, a Pockels cell can be switched very rapidly. In addition, high voltages can be switched. The Pockels cell driver circuit can be built with only a few components, so that the likelihood of failure is reduced.

The short-circuit switch can be configured in such a way that a voltage between the circuit nodes of >1000 V, in particular >2 kV, preferably >4 kV, in particular preferably also >8 kV, can be reduced to <100 V in a timespan of <200 ns, in particular <100 ns, preferably <50 ns, in particular preferably <10 ns.

The short-circuit switch can, moreover, be configured in such a way that a Pockels cell having a capacity of between 1 pF and 20 pF and having a voltage of >1000 V, in particular >2 kV, preferably >4 kV, in particular preferably also >8 kV, can be discharged to a voltage of <100V in a timespan of <200 ns, in particular <100 ns, preferably <50 ns, in particular preferably <10 ns. Particularly, very fast switching transistors are needed for the latter. In some cases, the short-circuit switch includes re-channel MOSFETs. In certain cases, the short-circuit switch includes very fast switching transistors other than MOSFETs.

In some implementations, the short-circuit switch is configured in such a way that an electrical charge of >100 nC, in particular >200 nC, preferably >400 nC, in particular preferably also >800 nC, can be discharged from the Pockels cell when the short-circuit switch is switched on within a timespan of <100 ns, in particular <10 ns.

In some implementations, to be able to switch the high voltages, the short-circuit switch includes a serial connection of multiple individual switches. The individual switches may be controllable semi-conductor elements that can be activated electronically, e.g., MOSFETs.

The first and second switches may, furthermore, each include a serial connection of multiple individual switches. This is likewise advantageous, in order to be able to switch high voltages. In that regard, the first and second switches may each include the same number of individual switches. The serial connection of the individual switches of the short-circuit switch may include more individual switches than the serial connection of the individual switches of the first switch, in particular twice as many. Conversely, the first and second switches may therefore have fewer individual switches than the short-circuit switch, in particular half as many. That saves on components and increases the level of safety.

Together with the serial connection of the individual switches of the first and second switches, the serial connection of the individual switches of the short-circuit switch forms a serial connection of all the individual switches. One or more resistors may be configured in said serial connection. That allows undesired oscillations to be attenuated. In particular, a resistor can be configured between the first circuit node and the positive potential and between the second circuit node and the negative potential, respectively. A resistor can in particular be arranged directly at the terminals of the respective positive and negative potentials. That provides particularly effective attenuation of the oscillations and maintains the symmetrical structure, which in turn improves the synchronous activation. The resistors can have values of between 1 and 200 ohms.

A Pockels cell can be connected to the circuit nodes. In particular, a resistor can be arranged between the first circuit node and a first Pockels cell terminal, as well as the second circuit node and a second Pockels cell terminal, respectively. The resistors also help to attenuate undesired oscillations. The resistors can have values of between 0.1 and 20 ohms.

Each individual switch may possess a turn-on driver, which is configured to transfer the individual switch into a conductive state. In particular, each individual switch may be allocated to a corresponding turn-on driver circuit. Each individual switch may be individually compared for its turn-on behavior and the switching times of the individual switches synchronized with one another.

Each individual switch may, furthermore, possess a turn-off driver circuit, which is configured to transfer the individual switch into a non-conductive state. In particular, each individual switch may be allocated to a corresponding turn-off driver circuit. Each individual switch may be individually adjusted in regard to its turn-off behavior and the switching times of the individual switches synchronized with one another. In particular, with a configuration which has a separate turn-off driver circuit and turn-on driver circuit respectively, turn-on times and turn-off times can be adjusted independently of one another. Thus, the switches can be actuated with minimal losses.

Both the turn-on driver circuit and the turn-off driver circuit may each have a first and second input terminal, and each a first and second output terminal. As a result, it is possible to activate the individual switches by means of signal transformers. It is therefore advantageous if the turn-on driver circuits or the turn-off driver circuits each have a signal transformer, in particular of identical construction.

The signal transformers may have primary side terminals that are each connected to an input terminal. The signal transformers may each be connected to a first terminal of a secondary side with a power terminal of the associated individual switch, in particular directly. A potential isolation can be implemented through the signal transformers. The use of signal transformers moreover has the advantage that an activation of the individual switches symmetrically and at absolutely the same moment is possible.

The signal transformers may each be connected with a second terminal on the secondary side to a drive terminal of the individual switch allocated. The signal transformers may be connected, each with a second terminal of the secondary side, via an interconnection, in particular having a component with a non-linear current/voltage characteristic, preferably including a diode or a serial connection of a diode with a Zener diode, with a drive terminal of the individual switch allocated. In this way, the electrical charge is advantageously conducted to the control terminal and keeps the switches, especially the transistors, switched on for a sufficiently long period of time. In the case of a serial connection comprising a diode and Zener diode, the diode and Zener diode may be connected with one another inversely. Thus, the voltage can be adjusted at the control terminal, and the switching speed is increased. The Zener diode goes into conductive mode if the change in the voltage is very significant at the transformer output. In this way, switching can be effected safely, and oscillations can be avoided.

The turn-on driver circuits of the first and second switches and the turn-off driver circuit of the short-circuit switch can be connected at their respective input terminals in a first serial connection. It can thereby be ensured that the short-circuit switch is always actively blocked when the first and second switches switch on. A synchronized, in particular simultaneous, switching can be achieved through the serial connection.

The turn-off driver circuits of the first and second switches and the turn-on driver circuit of the short-circuit switch can be connected at their respective input terminals in a second serial connection. It can thereby be ensured that the first and second switches are synchronized, in particular are simultaneously switched off when the short-circuit switch is switched on.

The serial connection of the turn-off driver circuits of the first and second switches and the turn-on driver circuit of the short-circuit switch can be connected to a driver voltage via a first drive switch. The driver voltage may be about 350 V, and may in particular fall within the range of 100 to 500 V.

The serial connections of the turn-on driver circuits of the first and second switches and the turn-off driver circuits of the short-circuit switch may be connected to a separate or the same driver voltage via a second driver switch.

When the first and second switches are closed, the circuit nodes may be at a common potential of the same absolute value. In other words, the circuit nodes may essentially be at the same absolute value of the potential at different polarities. That results in the Pockels cell terminals having a symmetrically distributed positive and negative potential in relation to ground (earth potential).

One or more turn-on driver circuits, in particular all of them, and one or more turn-off driver circuits, in particular all of them, for the Pockels cell driver circuit may be on a potential that has a potential distance to ground of less than 50 V or is connected to ground.

The earth potential can, in particular, be connected to a housing ground or be on the same or close to the potential of the ground housing. Here, the term "Close" means that the potential difference between the housing ground and the median potential is 100 times smaller than the absolute value of the first or second potential.

Provision can be made for resistors—in particular two resistors—to especially be switched in series, between the power terminals of an individual switch. This means that the power terminals of an individual switch may be connected with one another via resistors. These resistors act to balance. In particular in the case of closed switches, in this way it can be ensured that the voltage drop at the individual switches is distributed over the individual switches as evenly as possible, so that an individual switch does not have to block the entire voltage. In addition, it can thereby be ensured that the individual switches can be simultaneously turned on and off. The gate capacities can be discharged through the resistors. The resistors preferably have a resistance value of >110 kOhm.

Capacitive elements, in particular capacitors, can be provided between the power terminals of an individual switch. That means that the power terminals of an individual switch can be connected with one another via capacitive elements, in particular at least two capacitive elements, in particular capacitive elements switched in series. The capacitive elements also achieve balancing. They especially ensure that uneven capacities of the individual switches arising due to the voltage difference between the individual switches and the reference ground are equalized. In the case of individual switches, which viewed from the Pockels cell, have the potential that is at the greatest distance, such capacities may turn out to be the smallest. They may in particular lapse, i.e., be not at all present. The capacitance values of the capacitive elements preferably fall into the range of between 4 pF and 100 pF. The values of the resistors preferably fall within the range between 100 kOhm and 100 MOhm, in particular between 400 kOhm and 40 MOhm. Vibrations can also be avoided through the capacitive elements.

Resistors can, moreover, be provided in the first and in particular also in the second serial connection. In particular resistors of identical construction with values of the same amount can be used, especially in the range of between 1 ohm and 50 ohms, in particular between 10 ohms and 50 ohms. Such resistors serve to attenuate any oscillations. Such oscillations may occur if switches are actuated very rapidly. Such oscillations may switch on single individual switches again in the process of switching them off, which would be undesired, because the voltage of the positive or negative potentials could then load the remaining individual switches that have been switched off beyond their breakdown voltage.

Individual switches may be constructed as transistors and be placed on a substrate and the power terminals may be connected to bonding wires.

In order to activate at least the first or second switch, a planar transformer may be provided for. An individual planar transformer may in particular be provided for in order to activate each individual switch of the first or second switches. Planar transformers may have a good cooling connection and therefore be well cooled.

The Pockels cell driver circuit may be placed on a substrate and the substrate may be arranged on a ceramic cooling element. Cooling is advantageous, as a change in temperature may affect the switching flank of the Pockels cell. The ceramic cooling element may be designed as a planar ceramic cooling element with grooves, so that all the relevant components, such as the printed circuit board or a substrate, planar transformers and any (individual) switches have an optimum cooling connection.

Another aspect of the invention features a method for operating a Pockels cell with a Pockels cell driver circuit in accordance with the invention. The method includes closing the first and second switches and opening the short-circuit switch to charge the Pockels cell, and opening the first and second switches and closing the short-circuit switch to discharge the Pockels cell. Very steep switching flanks may be created as a result. In addition, high voltages can be switched in this way.

In some implementations, the short-circuit switch is only closed if the first and second switches are open. Losses and power and voltage peaks, which would damage both the switch and the Pockels cell, can thereby be avoided. Switching states in which the first and second switches and the short-circuit switch are closed simultaneously can be avoided.

The separate switches of the first and second switches can each be activated by their own turn-on driver circuit and turn-off driver circuit respectively. That increases the reliability and the switching speed. In addition, the individual switches can be better synchronized in this way. The individual switches of the short-circuit switch can each be activated by their own turn-on driver circuit and turn-off driver circuit respectively. Simultaneous switching can be effected if a first driver switch is closed in order to open the first and second switches and close the short-circuit switch synchronously. A second driver switch may, moreover, be closed in order to close the first and second switches and open the short-circuit switch synchronously. The voltage across the power terminals of individual switches of the first and second switches and/or the short-circuit switch may be kept symmetrical.

Other advantages and advantageous embodiments of the subject-matter of the invention will be appreciated from the description, the claims and the drawings. The features mentioned above and those set out below may also be used individually per se or together in any combination. The embodiments shown and described are not intended to be understood to be a conclusive listing but are instead of exemplary character for describing the invention. The Figures of the drawings show the subject-matter according to the invention in a highly schematic manner and are not intended to be understood to be to scale.

DETAILED DESCRIPTION

Figure 1:
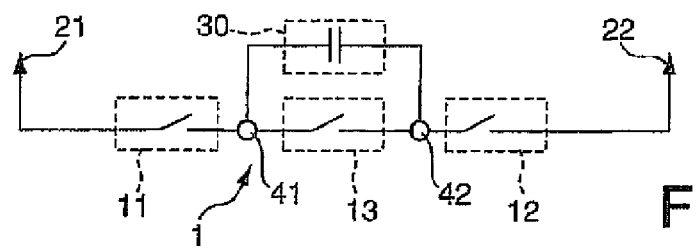
FIG. 1 is a schematic diagram of a Pockels cell with a Pockels cell driver circuit.

FIG. 1 shows a Pockels cell driver circuit 1, to which a Pockels cell 30 is connected. The Pockels cell 30 is in particular connected to a first circuit node 41 and a second circuit node 42 of the Pockels cell driver circuit 1. The first circuit node 41 is connected to a positive potential 21 via a first switch 11. The second circuit node 42 is connected to a negative potential 22 via a second switch 12. The circuit nodes 41, 42 are connected with one another via a short-circuit switch 13.

Figure 2:
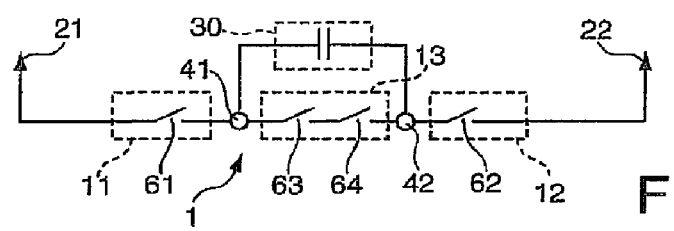
FIG. 2 is another schematic diagram of a Pockels cell with a Pockels cell driver circuit, where additional individual switches are shown in comparison to FIG. 1.

In the embodiment shown in FIG. 2, the first switch 11 has a serial connection of multiple individual switches 61, of which only a single switch 61 is shown in FIG. 2 for illustration. The second switch 12 has a serial connection of multiple individual switches 62, of which only one individual switch 62 is shown for illustration. The short-circuit switch 13 has a serial connection of multiple individual switches 63, 64.

Figure 3:
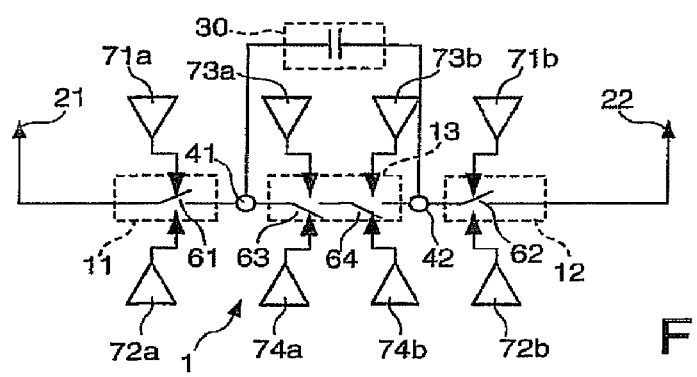
FIG. 3 is another schematic diagram of a Pockels cell with a Pockels cell driver circuit, where additional driver circuits are shown in comparison to FIGS. 1 and 2.

As can be inferred from FIG. 3, a turn-on driver circuit 71a, 71b is allocated to each of the individual switches 61, 62 of the first and second switches 11, 12, which are configured to transfer the individual switches 61, 62 into a conductive state. Furthermore, turn-off driver circuits 72a, 72b are allocated to the individual switches 61, 62, which are configured to transfer the individual switches 61, 62 into a non-conductive state.

Turn-on driver circuits 74a, 74b and turn-off driver circuits 73a, 73b are thus allocated to the individual switches 63, 64 of the short-circuit switch 13. The turn-on driver circuits 74a, 74b are configured to close the individual switches 63, 64, while the turn-off driver circuits 73a, 73b are configured to open the individual switches 63, 64.

Figure 4:
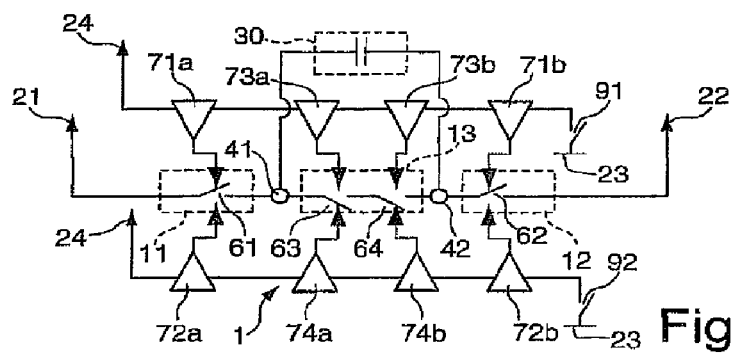
FIG. 4 is another schematic diagram of a Pockels cell with a Pockels cell driver circuit, where the wiring of the driver circuits is shown in comparison to FIG. 3.

It can be inferred from FIG. 4 that the turn-on driver circuits 71a, 71b, as well as the turn-off driver circuits 73a, 73b, are connected in series. This serial connection is connected to a driver voltage 24, as well as a ground potential 23. The serial connection can be activated by a driver switch 91 likewise contained in the serial connection. If the driver switch 91 is closed, this also leads to the individual switches 61, 62, and thus the first and second switches 11, 12, being turned on in consequence of the activation of the turn-on driver circuits 71a, 71b (and remaining turned on). In that way, the Pockels cell 30 is charged. Switching on the driver switch 91 moreover leads to the turn-off driver circuits 73a, 73b being activated and the individual switches 63, 64 being opened and kept open.

Figure 5:
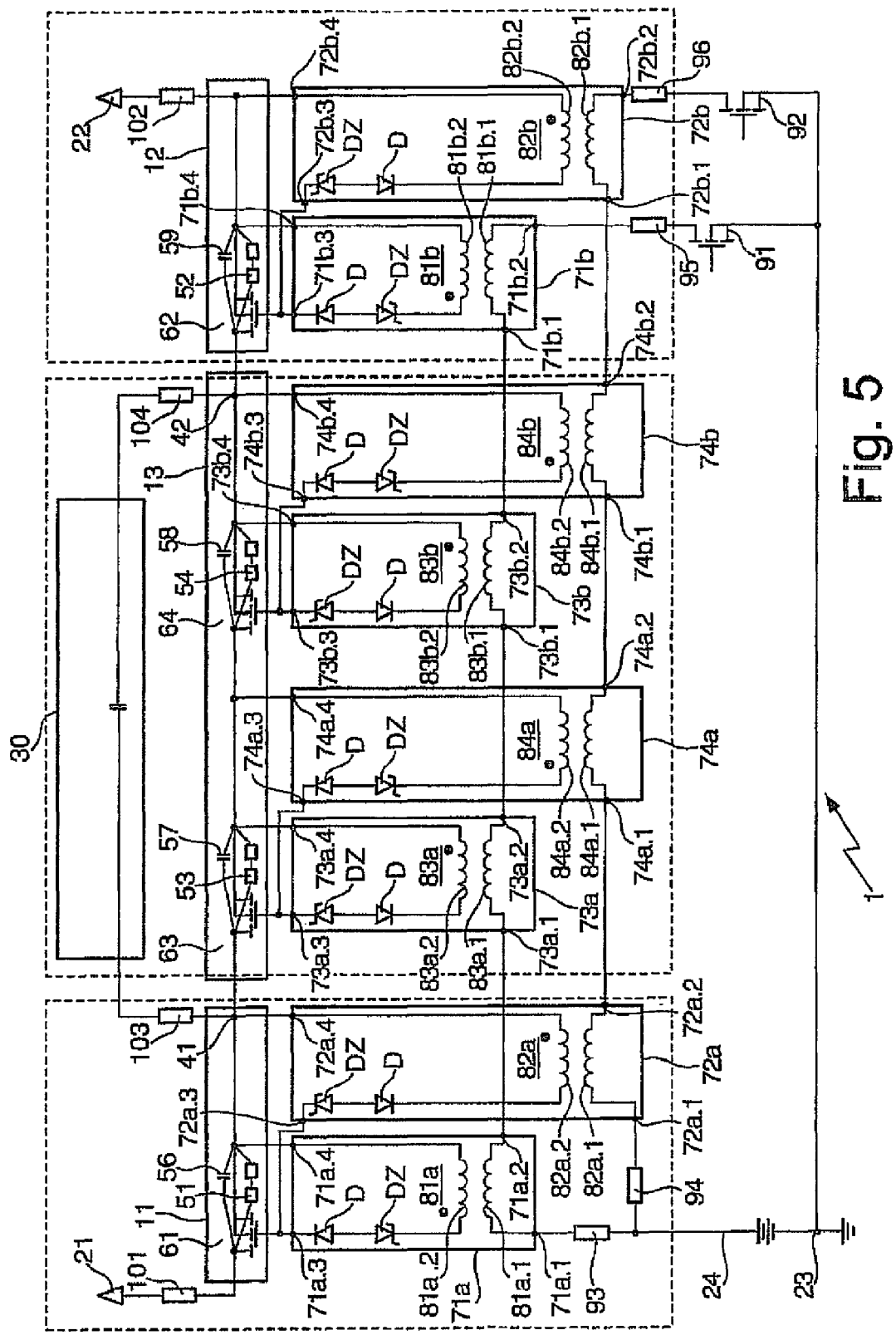
FIG. 5 is another schematic diagram of a Pockels cell with a Pockels cell driver circuit.

A further serial connection includes the driver voltage 24, the turn-off driver circuits 72a, 72b and the turn-on driver circuits 74a, 74b, as well as the driver switch 92, which is connected to the ground potential 23. If the driver switch 92 is briefly turned on, this leads to the turn-off driver circuits 72a, 72b becoming active, which leads to the individual switches 61, 62 being opened and remaining open, and thus the first switch 11 and the second switch 12 being opened. The turn-on driver circuits 74a, 74b of the individual switches 63, 64 are simultaneously activated, which leads to the individual switches 63, 64 being closed, and thus the short-circuit switch 13 being closed. In that way, the Pockels cell 30 is discharged. FIG. 5 shows a Pockels cell driver circuit 1, to which a Pockels cell 30 is connected. The Pockels cell 30 is in particular connected via resistors 103, 104 to a first circuit node 41 and a second circuit node 42 of the Pockels cell driver circuit 1. The first circuit node 41 is connected to a positive potential 21, in particular +2000V, via a first switch 11 and a resistor 101. The second circuit node 42 is connected to a negative potential 22, in particular −2000V, via a second switch 12 and a resistor 102. The circuit nodes 41, 42 are connected with one another via a short-circuit switch 13. The first switch 11 has a serial connection of multiple individual switches 61, where, for illustration, only one individual switch 61 is shown in FIG. 5. The second switch 12 has a serial connection of multiple individual switches 62, of which only one individual switch 62 is shown for illustration. The short-circuit switch 13 has a serial connection of multiple individual switches 63, 64.

A turn-on driver circuit 71a, 71b is allocated to each of the individual switches 61, 62 of the first and second switches 11, 12, and the turn-on diver circuits 71a, 71b are configured to transfer the individual switches 61, 62 into a conductive state. The turn-on driver circuits 71a, 71b each have a signal transformer 81a, 81b. The primary sides 81a.1, 81b.1 are connected with input terminals 71a.1, 71a.2 and 71b.1, 71b.2. The secondary sides or secondary coils 81a.2, 81b.2 are connected with output terminals 71a.3, 71a.4, 71b.3 and 71b.4.

Furthermore, turn-off driver circuits 72a, 72b are allocated to the individual switches 61, 62, which each have a signal transformer 82a, 82b. The signal transformers 82a, 82b each have a primary side 82a.1, 82b.1, as well as a secondary side 82a.2, 82b.2. The primary side 82a.1, 82b.1 or primary coil of the signal transformers 82a, 82b is connected with input terminals 72a.1, 72a.2 or 72b.1, 72b.2. The secondary sides or secondary coils 82a.2, 82b.2 are accordingly connected with output terminals 72a.3, 72a.4 or 72b.3, 72b.4.

Turn-on driver circuits 74a, 74b and turn-off driver circuits 73a, 73b are allocated to the individual switches 63, 64 of the short-circuit switch 13. The turn-on driver circuits 74a, 74b each have signal transformers 84a, 84b. The turn-off driver circuits 73a, 73b have signal transformers 83a, 83b. The primary sides or primary coils 84a.1, 84b.1 are connected with input terminals 74a.1, 74a.2 or 74b.1, 74b.2. The secondary sides or secondary coils 84a.2, 84a.2 are connected with output terminals 74a.3, 74a.4 or 74b.3, 74b.4.

The primary sides or primary coils 83a.1, 83b.2 are connected with input terminals 73a.1, 73a.2 or 73b.1, 73b.2. The secondary sides or secondary coils 83a.2, 83b.2 are accordingly connected with output terminals 73a.3, 73a.4 or 73b.3, 73b.4.

The input terminals 71a.1, 71a.2, 73a.1, 73a.2, 73b.1, 73b.2, 71b.1 and 71b.2 are connected with one another in series. This means that the input terminals 71a.1, 71a.2, 71b.1 and 71b.2 of the turn-on driver circuits 71a, 71b of the first and second switches 11, 12, as well as the input terminals 73a.1, 73a.2, 73b.1 and 73b.2 of the turn-off driver circuits 73a, 73b of the short-circuit switch 13 are connected with one another in series. A driver switch 91 is, moreover, contained in said serial connection, via which the primary sides 81a.1, 83a.1, 83b.1 and 81b.1 of the signal transformers 81a, 83a, 83b and 81b.1 of the turn-on driver circuits 71a, 71b and the turn-off driver circuits 73a, 73b can be connected with the driver voltage 24. The driver voltage may be some 350 V, and may in particular fall within the range of 100 to 500 V. A resistor 93 and a resistor 95 are, moreover, contained in said serial connection. Such resistors serve the purpose of attenuating any oscillations which may occur during the switching operation.

The input terminals 72a.1, 72a.2, 74a.1, 74a.2, 74b.1, 74b.2, 72b.1 and 72b.2 are, moreover, connected with one another in series. Said serial connection likewise contains a driver switch 92, via which the second serial connection can be connected with the driver voltage 24. A resistor 94 and a resistor 96 are, moreover, contained in this serial connection. Such resistors likewise serve the purpose of attenuating any oscillations which may occur during the switching operation. 23 specifies a median potential.

The output terminals 71a.3, 72a.3 are connected with a drive terminal of the individual switch 61. The output terminals 71a.4, 72a.4 are connected with a power terminal of the individual switch 61. The output terminals 73a.3, 74a.3 are connected with the drive terminal of the individual switch 63 and the output terminals 73b.3, 74b.3 are connected with the drive terminal of the individual switch 64. The output terminals 73a.4, 74a.4 are connected with a power terminal of the individual switch 63 and the output terminals 73b.4, 74b.4 are connected with a power terminal of the individual switch 64.

The output terminals 71b.3, 72b.3 are connected with the drive terminal of the individual switch 62. The output terminals 71b.4, 72b.4 are connected with a power terminal of the individual switch 62.

Figure 6:
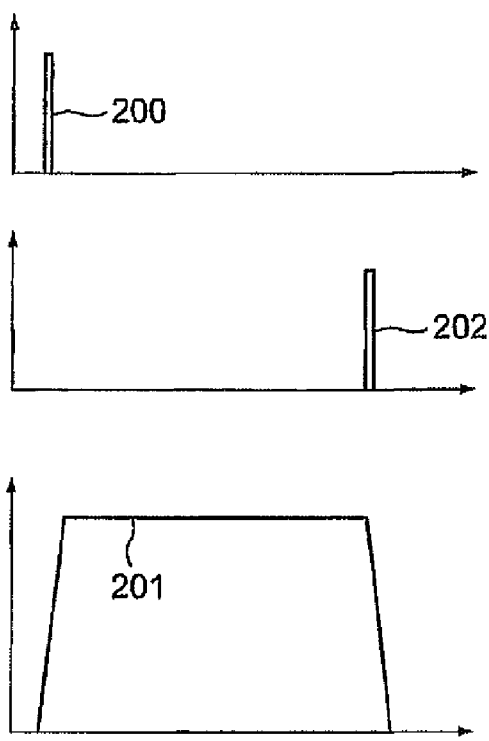
FIG. 6 shows time diagrams showing turning on and off of a Pockels cell.

When the driver switch 91 is switched on, which is shown in FIG. 6 with the reference sign 200, this leads to the individual switches 61, 62, and thus the first and second switches 11, 12, being switched on in consequence of the turn-on driver circuits 71a, 71b being switched on (and remaining switched on). In this way, the Pockels cell is charged, i.e., the Pockels cell 30 gives rise to a voltage of around 4000V in the embodiment, which is shown in FIG. 6 with the reference sign 201. Switching on the driver switch 91 has moreover led to the turn-off driver circuits 73a, 73b being activated and the individual switches 63, 64 being opened and kept open.

If the driver switch 92 is briefly turned on, as is shown with the reference sign 202 in FIG. 6, this leads to the turn-off driver circuits 72a, 72b becoming active, which leads to the individual switches 61, 62 being opened (and remaining open), and thus the first switch 11 and the second switch 12 being opened. The turn-on driver circuits 74a, 74b of the individual switches 63, 64 are simultaneously activated, which leads to the individual switches 63, 64 being closed, and thus the short-circuit switch 13 being closed. In that way, the Pockels cell 30 is discharged.

In the circuit according to FIG. 5, it can be recognized that resistors 51 are switched across the power terminals of the individual switch 61, resistors 53 across the power terminals of the individual switch 63, resistors 54 across the power terminals of the individual switch 64 and resistors 52 across the power terminals of the individual switch 62. These resistors, just like the capacitors 56, 57, 58, 59 connected in parallel thereto, serve the purpose of achieving balancing. In particular in the case of closed individual switches 61, 62, 63, 64, it should be ensured that the voltage drop at each of the individual switches 61, 62, 63, 64 is distributed as evenly as possible over the individual switches 61, 62, 63, 64, so that not a single individual switch 61, 62, 63, 64 has to block the entire voltage. The capacitors 56, 57, 58, 59 have the same purpose.

The resistors 93, 94, 95, 96 likewise shown in FIG. 5 serve to attenuate any oscillations. Such oscillations may occur if switches are switched very rapidly. Such oscillations may switch on single individual switches 61, 62, 63, 64 again in the process of switching them off, which would be undesired, because the voltage of the positive or negative potentials could then place a burden on the remaining individual switches 61, 62, 63, 64 that have been switched off, beyond their breakdown voltage. In the vicinity of the driver voltage 24, the resistors 93, 94 are arranged in a symmetrical configuration, in particular for both serial connections. The resistors 95, 96 are in the vicinity of the median potential 23 or in the vicinity of the driver switches 91, 92, likewise arranged in a symmetrical configuration, in particular for both serial connections. The resistors 101, 102, 103, 104 have a similar effect, i.e., they serve to attenuate oscillations.

Diodes are connected between the output terminals 71a.3, 72a.3, 73a.3, 74a.3, 73b.3, 74b.3, 71b.3 and 72b.3 and the secondary side of the signal transformers 81a, 82a, 83a, 84a, 81b, 82b, 83b and 84b. To be specific, a serial connection including a diode D and a Zener diode DZ is inserted before each of the output terminals 71a.3, 72a.3, 73a.3, 74a.3, 73b.3, 74b.3, 71b.3 and 72b.3. The diodes D and Zener diodes DZ are each connected with one another inversely. In this way, the switches 11, 12, 13 can be switched on and off rapidly and safely.

The polarity of the signal transformers 81a, 82a, 83a, 84a, 83b, 84b, 81b, 82b and the polarity of the diodes D, DZ is reversed with the short-circuit switch 13 in relation to the first and second switches 11, 12. It is thereby ensured that the first and second switches 11, 12 and the short-circuit switch 13 are always connected inversely.

It becomes clear from FIGS. 1 to 5 and the related description that the short-circuit switch 13 is designed, in its entirety, and suitably arranged, exclusively in order to reduce (and not increase) a potential applied between the first circuit node 41 and the second circuit node 42. In particular, no parts of the short-circuit switch 13 are suitably arranged to increase such potential.

It also becomes clear from FIGS. 1 to 5 and the related description that each individual switch 63, 64 of the short-circuit switch 13 is exclusively suitably arranged to reduce a potential applied between the first circuit node 41 and the second circuit node 42. In particular, none of the individual switches 63, 64 is suitably arranged to increase such potential.

It additionally becomes clear from FIGS. 1 to 5 and the associated description that the first switch 11 and each individual switch (61) of the first switch 11 is solely suitably arranged for connecting the first circuit node (41) with the first positive potential 21. In particular, no single switch belonging to switches 11, 61 is suitably arranged for reducing a potential applied between the first and second circuit nodes 41, 42. It additionally becomes clear from FIGS. 1 to 5 and the associated description that the second switch 12 and each individual switch 62 of the second switch 12 is solely suitably arranged for connecting the second circuit node 42 with the second negative potential 22. In particular, no single switch belonging to switches 12, 62 is suitably arranged for reducing a potential applied between the first and second circuit nodes 41, 42.

It additionally becomes clear from FIGS. 3 to 5 and the associated description that the Pockels cell driver circuit 1 is designed in such a way as to close all the individual switches 63, 64 of the short-circuit switch 13, by actuating a driver switch 92, simultaneously, and/or to open all the individual switches 63, 64 of the short-circuit switch 13 by switching on a driver switch 91 simultaneously.

It additionally becomes clear from FIGS. 3 to 5 and the associated description that the turn-on driver circuits 74a, 74b are designed in such a way as to close all the individual switches 63, 64 of the short-circuit switch 13 simultaneously, and/or the turn-off driver circuits 73a, 73b are designed in such a way as to open all the individual switches 63, 64 of the short-circuit switch 13 simultaneously.

It also becomes clear from FIGS. 3 to 5 and the associated description that multiple individual switches, in particular all individual switches 63, 64 of the short-circuit switch 13 are switched on or off simultaneously. In addition, it becomes clear that all the individual switches 61 of the first switch 11 and all the individual switches 62 of the second switch 12 are switched on or off simultaneously.

A number of embodiments of the invention have been described. Nevertheless, it will be understood that various modifications may be made without departing from the spirit and scope of the invention. Accordingly, other embodiments are within the scope of the following claims.

What is claimed is:

1. A driver circuit for a Pockels cell, the driver circuit comprising:
   a first circuit node configured to be connected to a first terminal of the Pockels cell, the first circuit node being connected via a first switch to a positive potential; and
   a second circuit node configured to be connected to a second terminal of the Pockels cell, the second circuit node being connected via a second switch to a negative potential,
   wherein the first circuit node is connected to the second circuit node via a short-circuit switch configured to be activated for discharge of the Pockels cell,
   wherein the first, second, and short-circuit switches each comprise a respective serial connection of one or more individual switches, and each of the individual switches comprises at least one of a turn-on driver circuit or a turn-off driver circuit, and
   wherein the first, second, and short-circuit switches are configured to include at least one of:

the turn-on driver circuits of the first and second switches and the turn-off driver circuits of the short-circuit switch connected in a first serial connection at respective input terminals of the turn-on driver circuits of the first and second switches and the turn-off driver circuits of the short-circuit switch, or the turn-off driver circuits of the first and second switches and the turn-on driver circuits of the short-circuit switch connected in a second serial connection at respective input terminals of the turn-off driver circuits of the first and second switches and the turn-on driver circuits of the short-circuit switch.

2. The driver circuit of claim 1, wherein the short-circuit switch is configured to reduce a voltage between the first and second circuit nodes from more than 1000 V to less than 100 V in a timespan of less than 200 ns.

3. The driver circuit of claim 1, wherein the short-circuit switch is configured to discharge an electrical charge of more than 100 nC within a timespan of less than 100 ns when the short-circuit switch is switched on.

4. The driver circuit of claim 1, wherein the turn-on driver circuits of the short-circuit switch are configured to close the individual switches of the short-circuit switch simultaneously.

5. The driver circuit of claim 1, wherein the turn-off driver circuits of the short-circuit switch are configured to open the individual switches of the short-circuit switch simultaneously.

6. The driver circuit of claim 1, wherein the serial connection of the individual switches of the short-circuit switch and the serial connections of the individual switches of the first and second switches form a united serial connection for the individual switches of the first, second, and short-circuit switches.

7. The driver circuit of claim 6, further comprising one or more resistors arranged in the united serial connection.

8. The driver circuit of claim 1, further comprising a first resistor arranged between the first circuit node and the positive potential and a second resistor between the second circuit node and the negative potential.

9. The driver circuit of claim 1, wherein the turn-on driver circuits of the first, second, and short-circuit switches are configured to turn the individual switches of the first, second, short-circuit switches into a conductive state.

10. The driver circuit of claim 1, wherein the turn-off driver circuits of the first, second, and short-circuit switches are configured to turn the individual switches of the first, second, and short-circuit switches into a non-conductive state.

11. The driver circuit of claim 1, wherein each of the turn-on driver circuits includes a first signal transformer and each of the turn-off driver circuits includes a second signal transformer, and wherein the first signal transformer and the second signal transformer have an identical construction.

12. The driver circuit of claim 1, wherein the first serial connection of the turn-on driver circuits of the first and second switches and the turn-off driver circuits of the short-circuit switch is connected to a driver voltage via a driver switch.

13. The driver circuit of claim 1, wherein the second serial connection of the turn-off driver circuits of the first and second switches and the turn-on driver circuits of the short-circuit switch are connected to a driver voltage via a driver switch.

14. The driver circuit of claim 1, wherein the first and second circuit nodes are at a common potential with a same absolute value when the first and second switches are closed.

15. The driver circuit of claim 1, further comprising at least one of a resistor or a capacitive element arranged between power terminals of one or more of the individual switches.

16. The driver circuit of claim 1, further comprising one or more resistors arranged in at least one of the first serial connection or the second serial connection.

17. A driver circuit for a Pockels cell, the driver circuit comprising:
a first circuit node configured to be connected to a first terminal of the Pockels cell, the first circuit node being connected via a first switch to a positive potential; and
a second circuit node configured to be connected to a second terminal of the Pockels cell, the second circuit node being connected via a second switch to a negative potential,
wherein the first circuit node is connected to the second circuit node via a short-circuit switch,
wherein the first, second, and short-circuit switches are configured to:
charge the Pockels cell by closing the first and second switches and opening the short-circuit switch, and
discharge the Pockels cell by opening the first and second switches and closing the short-circuit switch,
wherein the first, second and short-circuit switches each comprise at least one of a turn-on driver circuit or a turn-off driver circuit, and
wherein the first, second and short-circuit switch are configured to include at least one of:
the turn-on driver circuits of the first and second switches and the turn-off driver circuit of the short-circuit switch connected in a first serial connection, or
the turn-off driver circuits of the first and second switches and the turn-on driver circuit of the short-circuit switch connected in a second serial connection.

18. A method of operating a Pockels cell comprising:
charging the Pockels cell by simultaneously closing a first switch and a second switch in a Pockels cell driver circuit and opening a short-circuit switch in the Pockets cell driver circuit, wherein the Pockels cell driver circuit comprises:
a first circuit node configured to be connected to a first terminal of the Pockels cell, the first circuit node being connected via the first switch to a positive potential; and
a second circuit node configured to be connected to a second terminal of the Pockels cell, the second circuit node being connected via the second switch to a negative potential, wherein the first circuit node is connected to the second circuit node via the short-circuit switch; and
discharging the Pockels cell by simultaneously opening the first switch and the second switch and closing the short-circuit switch,
wherein the first, second, and short-circuit switches each comprise at least one of a turn-on driver circuit or a turn-off driver circuit, and
wherein the first, second, and short-circuit switches are configured to include at least one of:
the turn-on driver circuits of the first and second switches and the turn-off driver circuit of the short-circuit switch connected in a first serial connection, or the turn-off driver circuits of the first and second switches and the turn-on driver circuit of the short-circuit switch connected in a second serial connection.

\* \* \* \* \*